United States Patent [19]
Knecht

[11] Patent Number: 5,405,476
[45] Date of Patent: Apr. 11, 1995

[54] METHOD OF MOUNTING A PIEZOELECTRIC ELEMENT TO A SUBSTRATE USING COMPLIANT CONDUCTIVE MATERIALS

[75] Inventor: Thomas A. Knecht, Algonquin, Ill.

[73] Assignee: Motorola, Inc., Schaumburg, Ill.

[21] Appl. No.: 157,769

[22] Filed: Nov. 24, 1993

[51] Int. Cl.⁶ ............................................ H01L 41/18
[52] U.S. Cl. ..................................... 156/292; 310/348
[58] Field of Search ............... 29/25.35; 156/291, 292; 310/345, 348, 352, 353, 346

[56] References Cited

U.S. PATENT DOCUMENTS

| | | | |
|---|---|---|---|
| 4,666,547 | 5/1987 | Snowden, Jr. et al. | 156/305 |
| 4,703,218 | 10/1987 | Takahashi et al. | 310/348 |
| 4,750,246 | 7/1988 | Pollard | 29/25.35 |
| 4,757,581 | 7/1988 | Yamada et al. | 29/25.35 |
| 5,250,870 | 10/1993 | Fenlon et al. | 310/345 |

FOREIGN PATENT DOCUMENTS 52-56882 10/1977 Japan.

OTHER PUBLICATIONS

Conductive Elastomers Make Small, Flexible Contacts, Buchoff, Electronics, Sep. 19, 1974, pp. 122–125.

*Primary Examiner*—Michael W. Ball
*Assistant Examiner*—Richard Crispino
*Attorney, Agent, or Firm*—Gary J. Cunningham

[57] ABSTRACT

A method of mounting a piezoelectric element with a substrate. First, a compliant material (206) is dispensed on at least one side of the substrate (102) and cured. Next, a first conductive adhesive (216) is applied on the other side of the substrate (106). Third, a piezoelectric element (102) is positioned over the substrate (106). And thereafter, a second compliant conductive adhesive (222) is selectively dispensed such that it contacts an upper portion of one side of the piezoelectric element (102) and the substrate (106).

18 Claims, 2 Drawing Sheets

5,405,476

METHOD OF MOUNTING A PIEZOELECTRIC ELEMENT TO A SUBSTRATE USING COMPLIANT CONDUCTIVE MATERIALS

FIELD OF THE INVENTION

The present invention relates generally to frequency control devices and, in particular, to a method for mounting a piezoelectric element to a substrate.

BACKGROUND OF THE INVENTION

Piezoelectric devices, such as piezoelectric quartz filters, piezoelectric quartz resonators and the like, typically include a piece of piezoelectric material mounted to a substrate. In quartz devices, the quartz element of necessity has thin metallic electrodes attached to it through which electrical signals are coupled into and out of the piezoelectric quartz material. Common problems with piezoelectric devices are adequately isolating the piezoelectric device from mechanical shock and dealing with thermal expansion coefficient mismatches between the piezoelectric material and the substrate material.

Quite often, the piezoelectric devices, such as a piezoelectric quartz material and the substrate have mismatched thermal expansion coefficients. This mismatch can cause mechanical stresses to be induced in the quartz as time goes by during the life of such devices, as the quartz and substrate expand and contract over temperature variations. Further, mechanical shock transferred to the quartz through its mounting structure can increase mechanical stresses that in addition to the thermal stress, adversely affect the frequency, accuracy and longevity of such devices.

Various attempts over the years have been developed to compliantly mount piezoelectric quartz devices to a substrate. For purposes of this application, a compliant mount for a piezoelectric device, is a mounting device, apparatus or other mounting means that attempts to reduce or minimize mechanical stresses on the piezoelectric quartz element. Some prior art compliant mounting devices have used thin foil tabs that act as spring-type mounting structures that attempt to isolate the quartz element from its substrate. Other types of compliant mounting structures have attempted to use substrate materials having thermal expansion coefficients which more closely match the thermal expansion coefficient of the quartz material itself.

Examples of two prior art devices are shown in FIG. 1a and FIG. 1b.

In FIG. 1a, a loose tolerance clock oscillator 10 is shown. It is made as follows. Epoxy 12 is deposited onto a ceramic package 14. A quartz crystal 16 is placed onto the epoxy 12 and the epoxy 12 is cured in an oven. Two time consuming wirebonds 18 are then made between the quartz 16 and the ceramic 14. The coupling between the quartz 16 and the package 14 is rigid and direct and the frequency stability of the device is marginal, requires meticulous detail to assemble, and is not easily adapted to mass production. Also mechanical shock performance is poor because the mounting is rigid and the wirebonds can easily break.

In FIG. 1b, a cantilever type crystal mount 20 is shown. It is made as follows. First, epoxy 22 is dispensed on a left side of the ceramic 24. Next, a crystal 26 is suitably placed so that a bottom electrode 30 contacts epoxy 22. Thereafter, the cantilever mount 20 is turned upside down and inserted into a mating tool that sets the gap between the crystal and the ceramic 24 at the other side 28 at about 0.003" (0.08 mm). The cantilever mount 20 is then cured in an oven while upside down in the mating tool. Thereafter, an upper electrode 32 of the crystal 26 is coupled to a lead in the left side of the ceramic 24 with a conductive adhesive 34 extending from the upper electrode 34 to the lead (not shown) on the left side of the ceramic 24. The adhesive 34 is then cured. This operation is very difficult if not impossible to automate, and the cantilever mount 20 has marginal mechanical shock performance.

Most if not all of the prior art compliant mounting schemes are difficult to use because of the small physical dimensions that modern piezoelectric quartz elements have. Using bent foil tabs alone, for example, to compliantly mount a small sliver of quartz onto a substrate is not a structure that lends itself to economic mass production of quartz crystal devices.

There is a need for an improved method of mounting piezoelectric elements with ceramic substrates: (i) to minimize the mechanical stresses induced due to the thermal expansion mismatch between the two; (ii) to provide a mechanically sufficient coupling such that the device can withstand mechanical shocks; and (iii) to provide a method of crystal attachment which is adaptable to mass production. Accordingly, a low cost, readily-manufacturable, compliant mount for a piezoelectric device would be an improvement over the prior art. A method by which quartz devices can be easily and reliably attached to a substrate and which isolates the quartz element from mechanical stresses would be an improvement over the art.

DESCRIPTION OF THE PREFERRED EMBODIMENT

Figure 1A:
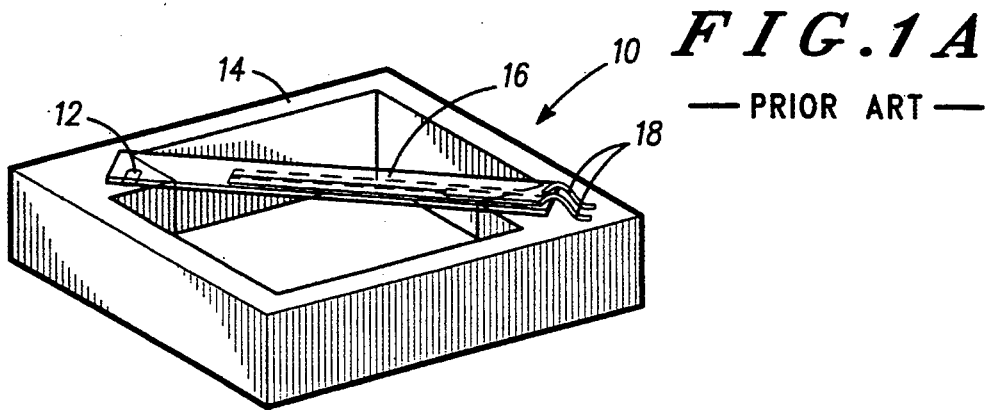
FIGS. 1a and 1b are enlarged perspective views of two prior art oscillators.
Figure 1B:
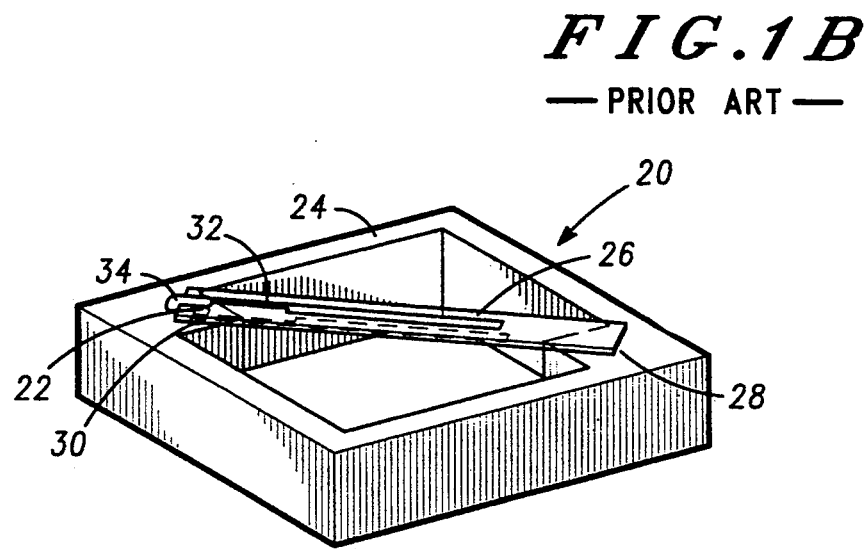
Figure 2:
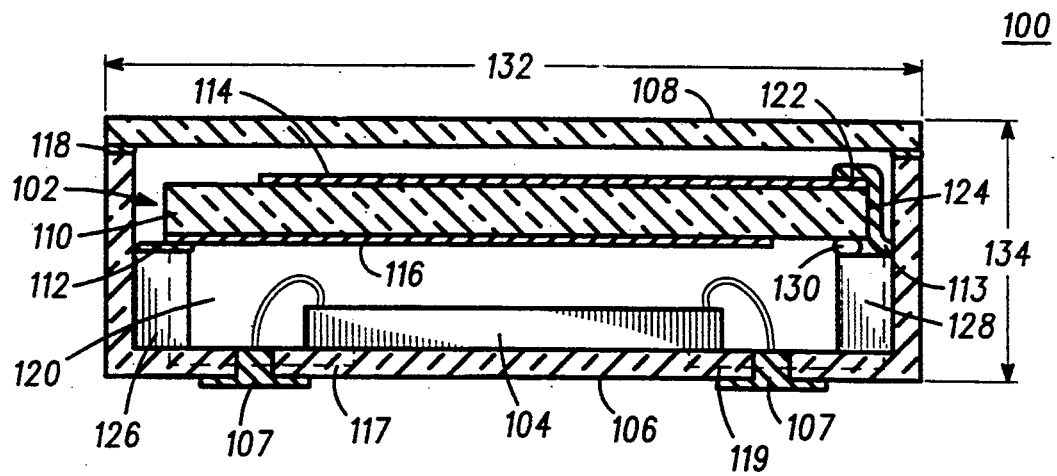
FIG. 2 shows an enlarged sectional view of a fully assembled temperature compensated crystal oscillator (TCXO) made in accordance with the present invention.
Figure 3:
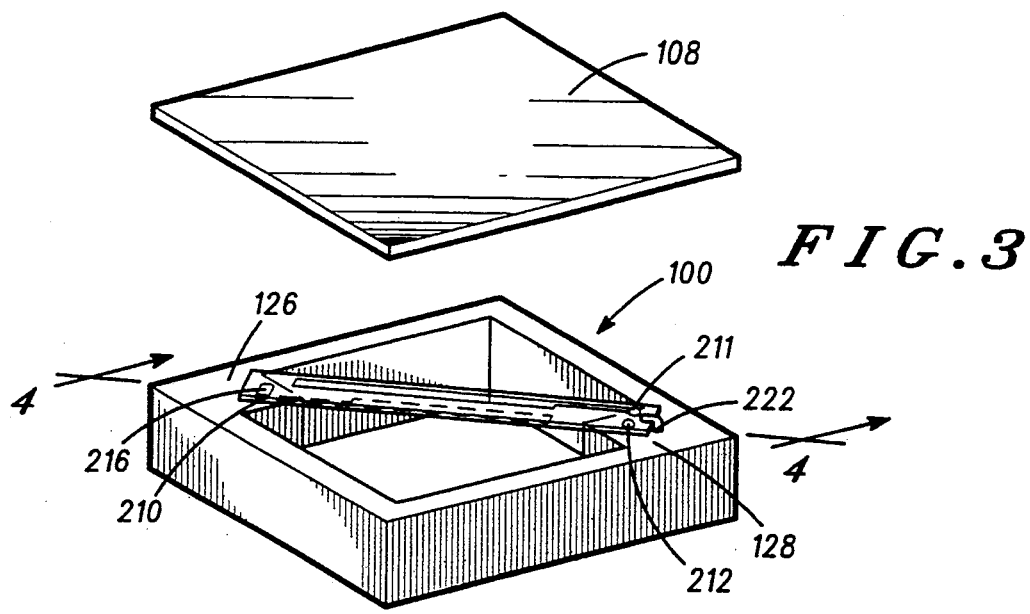
FIG. 3 shows a simplified enlarged perspective view of a TCXO, partially assembled, in accordance with the present invention.

The present invention provides an improved method of mounting a piezoelectric element to a substrate. In FIG. 2, a partially assembled temperature compensated crystal oscillator (TCXO) 100 is shown.

The TCXO 100 includes a piezoelectric element 102, a temperature compensation IC 104, a substrate 106, input-output pads 107 and a lid 108. A hermetic seal can be established by seam welding the lid 108 with the substrate 106, as shown by item 118, to form an inner inert environmemt 120 enclosing at least the piezoelectric element 102.

The temperature compensation IC 104 and chip capacitors (not shown) can be positioned within the same environment 120. The temperature compensation IC 104 is typically electrically wire bonded to metallized areas on the substrate 106. Suitable tungsten-filled feedholes are used to complete a connection of the compensation IC 104 to the input/output pads 107.

The piezoelectric element 102 can include a quartz strip, an AT-cut quartz crystal strip, an AT-cut quartz round crystal and the like, and preferably AT-cut quartz crystal strips because they are small, light weight and have improved mechanical resilience due to a low mass. The AT-cut quartz crystal strip 110 has a top electrode 114 and a bottom electrode 116. The electrodes 114 and 116 are electrically and mechanically connected to left and right leads 117 and 119 (shown as dashed lines in FIG. 2). The leads 117 and 119 are suitably electrically coupled to the compensation IC 104. The leads 117 and 119 extend from the top of left and right ledges (or sides) 126 and 128, through the ledges to a bottom of the substrate 106 and are coupled to IC 104.

As shown in FIG. 2, a compliant conductive adhesive 112 couples the bottom electrode 116 to the left lead 117 on ledge 126. On the other ledge 128, a compliant wrap around 113 is shown attaching an upper edge 122 and may touch a side edge 124 of the piezoelectric element 102, to establish an electrical connection with the top electrode 114 and the right lead 119 on a top of ledge 128. In this configuration, the piezoelectric element 102 is in the form of a crystal strip 110, and the compensation IC 104 and crystal strip 110 are electrically coupled by leads 117 and 119, such that frequency tuning and temperature compensation can occur.

A bumper element 130 allows the piezoelectric element 102 to slide or expand and contract substantially horizontally, due to the differences in thermal expansion coefficients, between the piezoelectric element 102 and substrate 106. The bumper element 130 allows the piezoelectric element 102 to slide along a smooth surface defined by a compliant and substantially unabrasive surface of bumper element 130, rather than sliding across a rough-metallized ceramic surface.

The dimensions of the TCXO 100 can range widely. Typically, the TCXO 100 is about 0.350 in (8.89 mm)×about 0.350 in. (8.89 mm)×about 0.110 in (2.79 mm). The height 134 is sufficient to enclose the components in the environment 120 and to minimize stray or unwanted capacitances to the piezoelectric element 102.

Mounting piezoelectric elements to substrates, as detailed below, can improve mechanical and electrical connections, increase the stability of a TCXO and can provide an improved and more reliable output.

Figure 4:
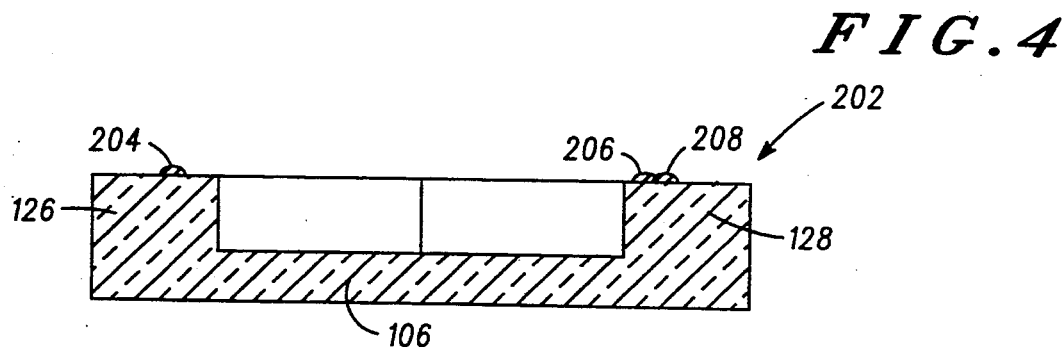
FIG. 4 shows a simplified sectional view of the TCXO in FIG. 3 taken along the line 4—4, showing a first major step in accordance with the present invention.

In its simplest form, the various steps of the present method are described below. In FIG. 4, the first step or the dispensing step 202 is shown, which includes dispensing a compliant material 208 on at least a right side or ledge 128 of a substrate 106 and thereafter curing the compliant material 208 to suitably form a cured compliant material 212. The cured compliant material 212, as shown in FIGS. 5 and 6, forms a suitably smooth bumper to allow the piezoelectric element 102 to expand and contract horizontally on a smooth surface.

Figure 5:
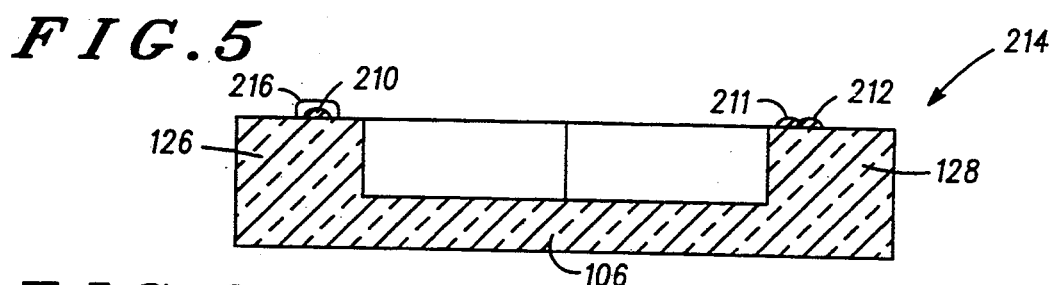
FIG. 5 includes a simplified sectional view of the TCXO in FIG. 3 taken along the line 4—4, showing a second major step in accordance with the present invention.

The second major step is shown in FIG. 5. The application (or applying) step 214 includes applying a first conductive adhesive 216 on the left ledge 126 of the substrate 106. A sufficient amount of adhesive 216 is applied to promote improved bonding and connection of the piezoelectric element 102 to the substrate 106.

Figure 6:
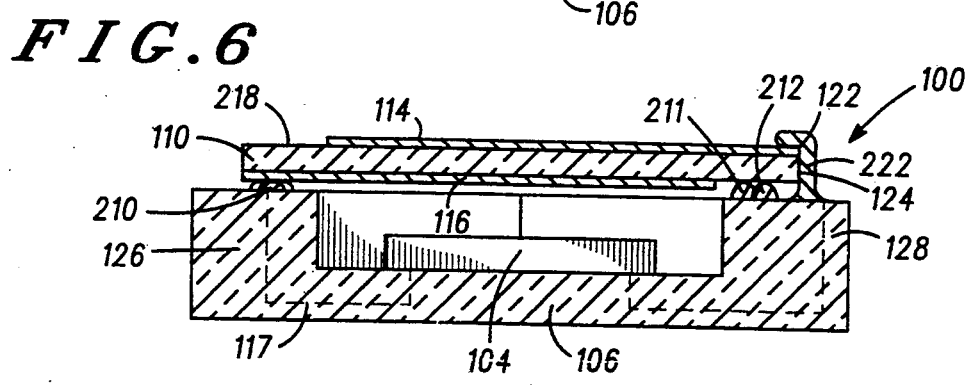
FIG. 6 includes a simplified sectional view of the TCXO in FIG. 3 taken along the line 4—4, showing the third and fourth major steps in accordance with the present invention.

The third step or the positioning step 218 is shown in FIG. 6. The positioning step 218 includes positioning and aligning the piezoelectric element 102 over the substrate 106 such that the active region (or middle area) of the piezoelectric element 102 does not contact the substrate 106 or any adhesives.

And the fourth step or the selectively dispensing step 220, includes selectively dispensing a second compliant conductive adhesive 222 in FIG. 6 (item 113 in FIG. 2) such that it contacts piezoelectric element 102, preferably the upper edge portion 122 of the right side of the element 102 and the substrate 106 to form a wraparound. The first conductive adhesive 216 and the second compliant conductive adhesive 222 (also referred to as a wraparound 222) are then suitably cured.

This method provides a simplified and mass producable method of attaching piezoelectric elements to ceramic packages. In addition, this method provides advantages in that the separation between the piezoelectric element 102 and substrate 106 is controlled to allow for minimal mechanical coupling, improved crystal performance and improved mechanical shock resistance.

In more detail, the dispensing step 202 in FIG. 4, can include dispensing at least a dollop of a compliant material 204 on the left ledge 126 and at least one dollop 206 on the right ledge 128 of the substrate 106, and more preferably dispensing one dollop of compliant material 204 on the left side 126 and two distinct and separate adjacent dollops of compliant material 206 and 208 on the right side 128 of the substrate 106, for an improved compliant mounting and platform support. Alternatively, a line of material can be dispensed substantially perpendicular to the piezoelectric element 102, on the right side 102 if desired.

The compliant material 204, 206 and 208 is cured before the positioning step 218 to provide a three point support and cushion. Stated differently, the three dollops of cured compliant material 210, 211 and 212 define a plane for improved cushioning and shock resistance, and minimizing the possibility of unwanted movement or shifting during fabrication or thereafter.

As should be understood by those skilled in the art, the compliant material herein can comprise various materials, so long as they are compliant and have a suitable viscosity so as to minimize the possibility of unwanted spreading or excessive flowing during application. It is also desirable that the cured compliant material 210, 211 and 212 form a dome-like structure, mound, bumper or cushion means.

In a preferred embodiment, the cured compliant material 210, 211 and 212 in FIG. 5, forms a 3 point support for the piezoelectric element 102, adapted to receive, support, cushion and suitably space the piezoelectric element 102 from the substrate 106. Examples of compliant materials 210, 211 and 212 can include but are not limited to any one or more of the following: silver-filled silicone, silicone, epoxy, and silver-filled epoxy.

The term "compliant" as used herein includes its normal dictionary meaning of being ready or disposed to comply. For example, a cured compliant material as used herein includes a certain threshold resilience and ability to yield elasticly when a force is applied without degrading, and desirably is conformable, adaptable, pliable and flexible. In a preferred embodiment, the cured compliant materials 210, 211 and 212 and cured wraparound 222 substantially include these characteristics.

The application step 214 includes applying or dispensing a sufficient amount of the first conductive adhesive 216 such that it thoroughly contacts at least the piezoelectric element 102 and the substrate 106, and preferably sufficiently contacts the left ledge 126 and bottom electrode 116 to electrically and mechanically connect the piezoelectric element 102 to the lead 117 and ledge 126. This step provides two features, namely: (i) electrically connecting the bottom electrode 116 to the lead 117; and (ii) providing the primary mechanical support of the piezoelectric element 102 by the substrate 106.

In a preferred embodiment, a line of the first conductive adhesive 216 is disposed to thoroughly cover the cured compliant material 210 as shown in FIG. 5, for improved cushioning, spacing and bonding.

The first conductive adhesive 216 can include any one or more of a wide variety of adhesives. In a preferred embodiment, the first conductive adhesive 216 comprises silicone, conductive epoxy, silver-filled silicone or the like, and more preferably silver-filled epoxy for very good outgassing characteristics that minimally degrade, during aging while enclosed in the inert environment 120. A preferred adhesive is known as Areicon C-990, available from Emerson & Cumings, Inc. (a division of W. R. Grace), 77 Dragon Court, Woburn, Mass. 01888.

The positioning step 218 includes carefully aligning and placing the bottom electrode 116 of the piezoelectric element 102 in proximity to the left ledge 126 and lead 117 of the substrate 106 to form an electrical connection by adhesive 216 to be made therebetween. Care in placement is also necessary so that the piezoelectric element 102 sits across ledges 126 and 128 to suitably isolate the active region from the two ledges 126 and 128. Thus, proper positioning minimizes the chances of the first conductive adhesive 216 contacting the active region, which can result in dampening and degrading the frequency performance of the TCXO 100.

As should be understood by those skilled in the art, the geometric shapes and sizes of the piezoelectric element used herein can vary widely so long as they have the desired characteristics, such as a stable frequency output over a wide temperature range. In a preferred embodiment, the piezoelectric element 102 comprises AT-cut quartz and is generally in a rectangular shape, which lends itself to photolithographic means of fabrication.

In the selective dispensing step 220 in FIG. 6, the second compliant conductive adhesive 222 is carefully dispensed so as to bond the top electrode 114 to the lead 119, thereby forming a conductive connection or wraparound. The second compliant conductive adhesive 222 can include a wide variety of adhesives so long as they are compliant to allow the piezoelectric element 102 to travel horizontally with respect to the substrate 106 due to the differences in thermal expansion coefficient. The second compliant conductive adhesive 222 can include silicone, epoxy or the like, preferably silver-filled silicone to provide a compliant electrical and mechanical connection, while allowing the piezoelectric element 102 and substrate 106 to expand and contract at different rates without putting undo stress upon the piezoelectric element 102, and thereby minimizing the possibility of undesirably changing the output frequency.

The first and second adhesive 216 and 222 can comprise the same or different materials, preferably different for the reasons described above.

The compliant materials 204, 206 and 208 and second compliant conductive adhesive 222 can comprise different or preferably the same materials, and most preferably include silver-filled silicone. This material provides: sufficient resilience for cushioning a piezoelectric element from shock; sufficient elasticity to allow expansion and contraction of the piezoelectric element 102 with respect to the substrate 106 with minimal stress; and sufficient conductivity. A preferred silver-filled silicone for use in the present invention is Emerson & Cuming's LE 3355-35.

The present method is particularly adapted for use in the manufacture of temperature compensated crystal oscillators.

After the compliant conductive adhesive 222 is cured, the TCXO 100 is suitably frequency tuned. Mass loading of the top side of the piezoelectric element 102 decreases the frequency until the desired frequency is achieved. Thereafter, a lid 108 preferably comprising a metal, is then parallel seam welded onto a brazed ring portion defined as the sidewalls of the substrate 106. A good weld can provide a seal to enclose the inert environment 120.

In more detail, either before or preferably after suitable placement of the components in the ceramic package 106, a preferred method can include the following steps: 1) Dispensing one dollop 204 of silver-filled silicone on left ceramic ledge 126 and two dollops 206 and 208 on the right ceramic ledge 128 in FIG. 4. 2) Curing the silver-filled silicone. Due to the low viscosity, the dollops form smooth and consistent hemispheres 210, 211 and 212, as shown in FIG. 5, approximately 0.003" (0.08 mm) high. 3) Dispensing a bead of silver-filled epoxy 216 in FIG. 5 on the left ledge 126 such that it has a larger volume than the cured silicone dollop 210 to couple lead 117. This forms the electrical connection between the bottom electrode 116 and the lead 117 or metallized portion of the ceramic substrate 106. 4) Placing the quartz strip 110 such that it rests on the epoxy dollop 216 on one side and the two cured silicone dollops 211,212 on the other side. This can be done manually or with automation. 5) Dispensing silver-filled silicone to contact top electrode 114 and lead 119. 6) Curing the epoxy 216 and silver-filled silicone wraparound 222 at the same time in an oven for a predetermined time and at a predetermined temperature. 7) Frequency tuning the quartz 110 by depositing metal onto the exposed surface or top electrode 114 of the metallized quartz. Typically, the tuning is accurate to within 5 ppm of the desired frequency. 8) Seam welding a metal lid 108 to the brazed portion (side walls) of the substrate 106.

An alternate method can include omitting the compliant material 204 in item 1. To supply a known gap between the quartz 110 and the ceramic ledges 126 and 128, the quartz 110 could be placed onto the wet epoxy 216 with a spacer tooling, such that about a 0.003" (0.08 mm) stop is made. The remaining steps would be followed except with respect to material 204 and 210. The end result could still resemble TCXO 100 in FIG. 2.

Although the present invention has been described with reference to certain preferred embodiments, numerous modifications and variations can be made by those skilled in the art without departing from the novel spirit and scope of this invention.

I claim:

1. A method of mounting a piezoelectric element to a substrate having left and right ledges, comprising the steps of:
   a) dispensing a compliant conductive material on a right ledge and a left ledge of a substrate and curing it;
   b) applying a first conductive adhesive at least partially on and in proximity to the cured compliant conductive material on the left ledge of the substrate;
   c) positioning the piezoelectric element over the substrate;
   d) selectively dispensing a second compliant conductive adhesive such that it contacts an upper portion of a right side of the piezoelectric element and the right ledge of the substrate to form a wraparound bonding structure; and thereafter,
   e) curing the first conductive adhesive and the second conductive adhesive to form a compliant and conductive (i) bond between a left side of the piezoelectric element and the left ledge comprising the compliant conductive material and the first conductive adhesive, and (ii) wraparound bonding structure coupling a right side of the piezoelectric element and the right ledge, respectively.

2. The method of claim 1, wherein the dispensing step includes dispensing at least one dollop of the compliant material comprising silver-filled silicone on the left ledge and at least one dollop on the right ledge of the substrate.

3. The method of claim 1, wherein the dispensing step includes dispensing one dollop of the compliant material on the left ledge and two adjacent dollops on the right ledge of the substrate, the compliant material comprising silver-filled silicone.

4. The method of claim 3, wherein the dispensing step includes curing the dollops to form a three point support for the piezoelectric element.

5. The method of claim 1, wherein the applying step includes applying a sufficient amount of the first conductive adhesive such that it contacts the piezoelectric element and the substrate to form an electrical connection.

6. The method claim 1, wherein the applying step includes applying the first conductive adhesive comprising conductive silicone or conductive epoxy and the selective dispensing step includes dispensing the second compliant conductive adhesive comprising silicone or epoxy.

7. The method of claim 1, wherein the positioning step includes aligning electrodes on the piezoelectric element with metallized portions of the substrate to form electrical couplings therebetween.

8. The method of claim 1, wherein the positioning step includes positioning a piezoelectric element comprising quartz over the substrate and aligning a first electrode on a lower portion of the quartz with a metallized portion of the substrate and aligning a second electrode on an upper portion of the quartz such that the second compliant conductive adhesive can be dispensed partially on the second electrode and partially on the substrate to electrically couple the second electrode with another metallized portion of the substrate.

9. The method of claim 1, further comprising the step of tuning the piezoelectric element to form a temperature compensated crystal oscillator.

10. A method of mounting a piezoelectric element with a ceramic package having left and right ledges, comprising the steps of:
    a) dispensing a compliant material on a left ledge and a right ledge of a ceramic package and curing the compliant conductive material to form a multipoint conductive support cushion;
    b) applying a first conductive adhesive substantially covering and in proximity to the cured compliant material on the left ledge of the package;
    c) positioning the piezoelectric element on the ledges of the package such that a left side and a right side of the piezoelectric element contact the conductive support cushion and the first conductive adhesive on the left ledge of the package;
    d) selectively dispensing a second compliant conductive adhesive such that it contacts a right portion of the piezoelectric element and the right ledge of the package, forming a wraparound structure; and thereafter,
    e) curing the first conductive adhesive and the second compliant conductive adhesive to form a compliant and conductive bond between the left side of the piezoelectric element and the left ledge and a wraparound structure, coupling a right side of the piezoelectric element and the right ledge, to allow the piezoelectric element and ceramic package to expand and contract substantially independently due to the differences in thermal expansion properties with minimal stresses being transferred to the piezoelectric element.

11. The method of claim 10, wherein the applying step includes applying a first conductive adhesive in proximity to the cured compliant material on the left and the right ledges of the package.

12. The method of claim 10, wherein the positioning step includes positioning the piezoelectric element comprising quartz over the package and aligning a first electrode on the quartz with a first metallized portion of the package and aligning a second electrode on an upper portion of the quartz with a second metallized portion of the package such that the second compliant conductive adhesive can be dispensed to electrically couple the second electrode and the second metallized portion of the package.

13. The method of claim 10, wherein the dispensing step includes dispensing one dollop of the compliant material on the left ledge and two adjacent dollops on the right ledge of the package.

14. The method of claim 10, further comprising the step of tuning the piezoelectric element.

15. The method of claim 14, further comprising the step of hermetically sealing the piezoelectric element in the package.

16. The method of claim 15, wherein the sealing step includes welding a parallel seam or applying a solder to attach a lid to the package.

17. The method of claim 10, further comprising connecting a temperature compensation integrated circuit is connected to the ceramic package before the dispensing step in a.

18. A method of mounting a piezoelectric element with a ceramic package having left and right ledges, comprising the steps of:
    placing a temperature compensation integrated circuit on a ceramic package;

dispensing one dollop of silver-filled silicone on a left ledge and at least two dollops on a right ledge of the ceramic package;

curing the silver-filled silicone, to form a substantially smooth and substantially consistent hemisphere;

dispensing a bead of silver-filled epoxy on the cured dollop on the left ledge such that it has a larger volume than the cured dollop;

placing a piezoelectric element such that it rests on the bead of silver-filled epoxy on the left ledge and the two cured silicone dollops on the right ledge;

dispensing silver-filled silicone to form a wraparound structure contacting an upper portion of the piezoelectric element and the right ledge;

curing the silver-filled epoxy and the silver-filled silicone wraparound structure;

frequency tuning the piezoelectric element by depositing metal onto an exposed surface of the piezoelectric element; and forming a temperature compensation crystal oscillator including a hermetic environment formed by coupling a lid to the ceramic package.

* * * * *